United States Patent
Koenenkamp et al.

(10) Patent No.: US 7,579,281 B2
(45) Date of Patent: Aug. 25, 2009

(54) TRANSISTOR ASSEMBLY AND METHOD OF ITS FABRICATION

(75) Inventors: Rolf Koenenkamp, Portland, OR (US); Jie Chen, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 352 days.

(21) Appl. No.: 11/327,218

(22) Filed: Jan. 9, 2006

(65) Prior Publication Data

US 2006/0121654 A1     Jun. 8, 2006

Related U.S. Application Data

(62) Division of application No. 10/487,802, filed as application No. PCT/DE02/03191 on Aug. 27, 2002, now abandoned.

(30) Foreign Application Priority Data

Aug. 27, 2001   (DE) ................................ 101 42 913

(51) Int. Cl.
    *H01L 21/302* (2006.01)
(52) U.S. Cl. ...................... 438/705; 438/156; 438/173; 438/269; 438/272; 257/E21.643; 977/938
(58) Field of Classification Search ................ 438/149, 438/156, 173, 268, 269, 272, 705; 257/E21.643; 977/938
See application file for complete search history.

(56) References Cited

U.S. PATENT DOCUMENTS

| | | | |
|---|---|---|---|
| 4,530,149 A | 7/1985 | Jastrzebski et al. |
| 5,106,778 A | 4/1992 | Hollis et al. |
| 5,324,673 A | 6/1994 | Fitch et al. |
| 5,414,289 A | 5/1995 | Fitch et al. |
| 5,668,391 A | 9/1997 | Kim et al. |
| 5,739,044 A | 4/1998 | Terasawa et al. |
| 5,981,970 A | 11/1999 | Dimitrakopoulos et al. |
| 6,107,660 A | 8/2000 | Yang et al. |
| 6,392,271 B1 | 5/2002 | Alavi et al. |

(Continued)

FOREIGN PATENT DOCUMENTS

DE     19916403     10/2000

(Continued)

OTHER PUBLICATIONS

S.M. Sze: "Physics of Semiconductor Devices", Second Edition, Bell Laboratories, Inc, Murray Hill, New Jersey, Wiley, New York, 1981, pp. 312-314 and pp. 431-433 (including front and back cover sheets).

(Continued)

*Primary Examiner*—Matthew Smith
*Assistant Examiner*—Julio J Maldonado
(74) *Attorney, Agent, or Firm*—Darby & Darby

(57) ABSTRACT

A transistor assembly with semiconductor material vertically introduced into micro holes (4) in a pliable a film laminate consisting of two plastic films (1, 3) with a metal layer (2) located therebetween. Said semiconductor material is provided with contacts (6, 7) by metalizing the top side and bottom side of the film laminate. The assembly is very strong by virtue of the fact that the film can be bent and stretched.

15 Claims, 4 Drawing Sheets

U.S. PATENT DOCUMENTS

| | | | |
|---|---|---|---|
| 6,426,259 B1 | 7/2002 | Yu | |
| 6,653,733 B1 | 11/2003 | Gonzalez et al. | |
| 6,740,910 B2 * | 5/2004 | Roesner et al. | 257/213 |
| 7,067,840 B2 * | 6/2006 | Klauk et al. | 257/40 |
| 2005/0071969 A1 | 4/2005 | Sirringhaus et al. | |

FOREIGN PATENT DOCUMENTS

| | | |
|---|---|---|
| JP | 614017 | 1/1986 |
| JP | 11329334 | 11/1999 |
| WO | WO0149402 A1 * | 7/2001 |
| WO | 0229912 | 4/2002 |

OTHER PUBLICATIONS

Kudo et al.: "Device characteristics of lateral and vertical type organic field effect transistors", Chiba University, Chiba, Japan, Eslevier, Thin Solid Films, 2001, pp. 362-367.

Garnier et al.: "Vertical device architecture by molding of organic-based thin film transistor", Applied Physics Letters, vol. 73, No. 12, Sep. 21, 1998, pp. 1721-1723.

International Search Report: Application No. PCT/DE 02/03191, Mailing Date: Nov. 29, 2002.

C. Rost et al., "Spatially distributed p-n heterojunction based on nanoporous $TiO_2$ and CuSCN", Applied Physics Letters, vol. 75, No. 5, Aug. 2, 1999, pp. 692-694.

* cited by examiner

TRANSISTOR ASSEMBLY AND METHOD OF ITS FABRICATION

REFERENCE TO RELATED APPLICATION

This is a divisional application of application No.: 10/487,802, filed 26 Feb. 2004, now abandoned, which is a U.S. National Phase application under 35 U.S.C. § 371 of International Application No. PCT/DE02/03191, filed on Aug. 27, 2002. This application also claims the benefit of German Patent Application No. DE 101 42 913.4, filed on Aug. 27, 2001. The International Application was published in German on Mar. 27, 2003 as WO 2003/026034 under PCT Article 21(2).

BACKGROUND OF THE INVENTION

1. Field of the Invention

The invention relates to a transistor arrangement and to a method of its fabrication.

2. The Prior Art

For fabricating thin-film transistors it is known to apply semiconductor material on a flexible substrate in a planar arrangement. When mechanical stress is applied to the substrates by bending, shearing or stretching, the thin-film transistors are also subjected to stress which can easily lead to damage of the semiconductor layers or to their separation from the substrate layer.

OBJECT OF THE INVENTION

It is an object of the invention to provide for a transistor arrangement and a method of its fabrication, using a flexible substrate wherein mechanical stresses do not result in deterioration of the function of the transistors.

BRIEF SUMMARY OF THE INVENTION

In accordance with the invention, the object is accomplished by a transistor arrangement comprising a laminate of at least two layers of plastic film with an interposed metal layer and provided with micro holes filed by a vertically introduced semiconductor material provided at at least one of the upper and lower surfaces of the laminate with at least one electrical contact.

Other objects will in part be obvious and will in part appear hereinafter.

Accordingly, the transistor arrangement is constructed such that semi-conductor material is vertically introduced into micro-holes of a film laminate consisting of two plastic films with an interposed metal layer, the semiconductor material being provided with contacts by metalization of the upper and lower surface of the film laminate.

In accordance with the invention, the micro holes used are cylindrical ion trace channels which are formed in polymer or polyester films by ion bombardment and a subsequent etching treatment. These ion trace channels may be filled by electrode deposition, precipitation in a chemical bath or by other suitable processes, with connecting semiconductors, or, initially, by a hollow-cylindrical insulation layer followed by a connecting semiconductor.

The film laminate into which the semiconductor material is embedded is fabricated by a film being coated with a metal layer, for instance by vaporization, and by a second film connected by an adhesive agent to the metal layer on the surface of the first film. Thereafter, ion bombardment is carried out in an accelerator. Along the ion trace, the ion bombardment results in the formation in the film of amorphous channels of a diameter of a few Angstroms. The ion trace channels thus formed are then sensitized for a subsequent etching treatment in the film which causes micro holes to be formed in the plastic films. Prior to sensitization, a further sensitization may optionally be performed with a chemical sensitizing agent. The method of forming micro holes in films has heretofore been used in connection with a single-layer film and without a metal layer between the layers of film for fabricating micro filters and in other applications. It has not been used, however, for fabricating transistors.

Following etching of the polymer films applied to both sides of the metal layer, the metal layer is removed by a further etching process in the area of the holes. For this purpose, the metal film may be removed sufficiently to extend just to the ion trace channel in the films. In the proposed transistor, the interposed metal layer serves as a gate terminal, and for that reason it should either form a Schottky contact (MESFET), or it should be insulated from the semiconductor (MOSFET) as shown in S. M. Sze, Physics of Semiconductor Devices, Wiley, N.Y., 1981, pp. 312 seq. and pp. 321 seq. Where the material combination of metal and semiconductor permits it, semiconductor material may be grown from the edge of the interposed metal layer by electrode deposition to form a MESFET, thus forming a Schottky contact.

For fabricating a MOSFET an insulation layer is initially deposited, for instance by precipitation in a bath, at the interior wall of the entire channel. An insulation layer may also be formed only in the area of the metal layer by chemically or electro-chemically converting, e.g. oxidizing, it from the micro holes. Instead of forming an insulation layer, the metal layer may be removed by etching around the micro hole thus forming an insulating cavity.

After the formation of micro holes from the ion trace channels has been completed, the semiconductor material is introduced by electrode deposition or by precipitation in a chemical bath. Drain and source contacts are formed by a subsequent metalization of the upper and lower surfaces of the film laminate. It may be necessary to metalize at least one surface of the film laminate prior to the electrode deposition in order to provide the electrode required for the application of a potential during the electrode deposition. By structuring the metalization layer by means of conventional lithographic processes, e.g. in matrix form, it is possible to connect transistors to form transistor units which may be energized together. The formation of transistor area arrangements may be augmented by masking the film laminate before the ion bombardment. Last but not least it is also possible to fabricate individual transistors at a predetermined site by bombarding the film laminate by a controlled ion beam for forming individual ion trace channels.

The advantage of the cylindrical vertical arrangement of the transistors is that they are mechanically very sturdy since the film is both flexible and stretchable. Moreover, the organic film material is substantially softer than inorganic transistor material. Consequently, all bending, shearing and pressure forces are wholly absorbed by the film material, thus rendering the characteristic curve of the transistors and other electrical parameters substantially constant, notwithstanding any bending, flexing and tensile forces.

Since the micro holes may be fabricated with diameters as small as 30 nm and since they may be filled with semiconductor material, it is possible to fabricate transistors on the nanometer scale without lithography and without masking technology. The channel length of the transistors is determined by the space charge range of the center gate contact. As a rule, it is substantially smaller than the thickness of the film which determined the distance between source and drain. Accordingly, the transistor is best operated in a depletion mode, see German patent specification 199 16 403 C. The small diameter and the small channel length open the possibilities of operating the transistor in a quantum regime.

Moreover, the possible minute dimensions also yield advantages in respect of integrated control circuits.

Many applications are possible. For use in the field of displays, a film of A4 size may be used with closely adjacent vertical transistors arrayed as optical pixels with about 1,00 transistors. While the transistors are distributed randomly, the large number of transistors in the pixels nevertheless permits a precise energization of the pixels. At a diameter of the transistors of 150 nm and an average spacing of 500 nm, 1,000 transistors result in a size of pixel of about 20×20 µm, which constitutes a conventional size.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

Figure 4A:
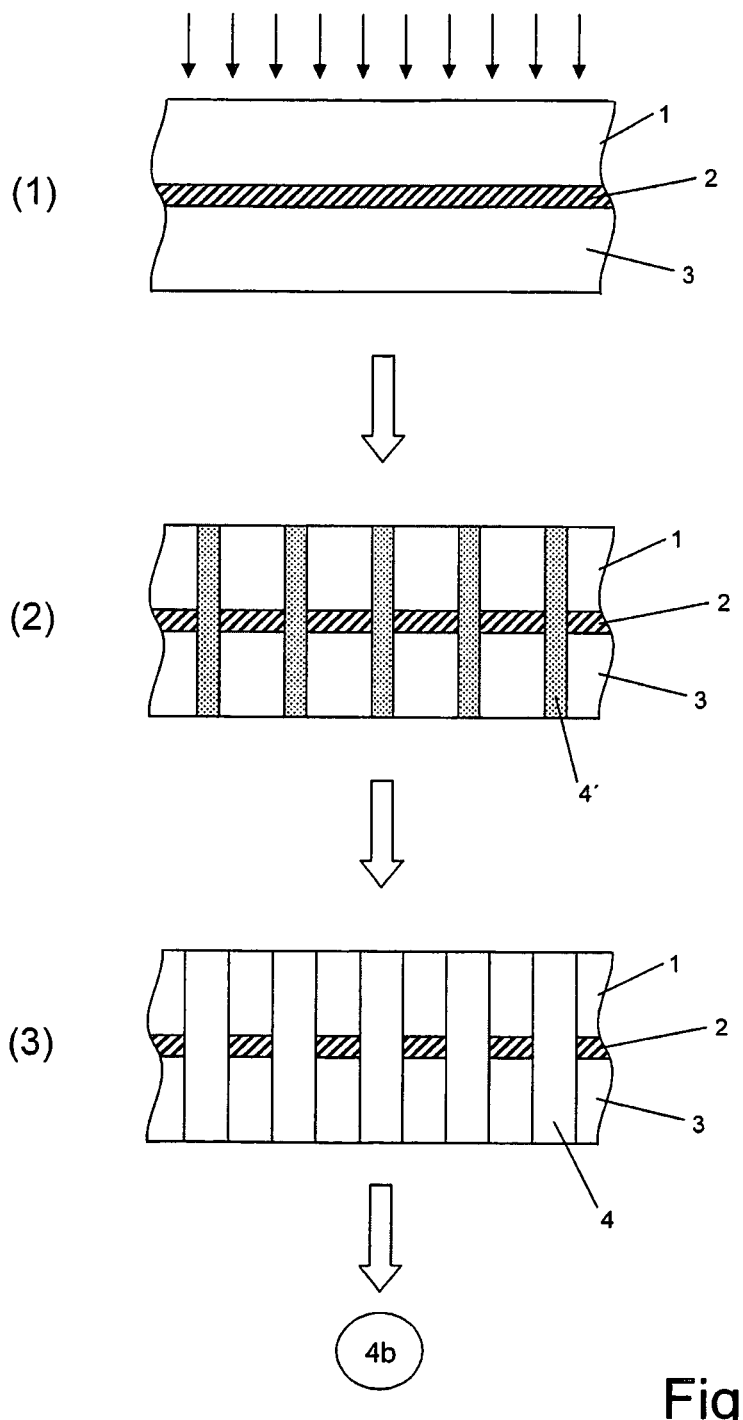
FIGS. 4a and 4b depict the steps of an embodiment of a method for fabricating a transistor in accordance with the invention.
Figure 4B:
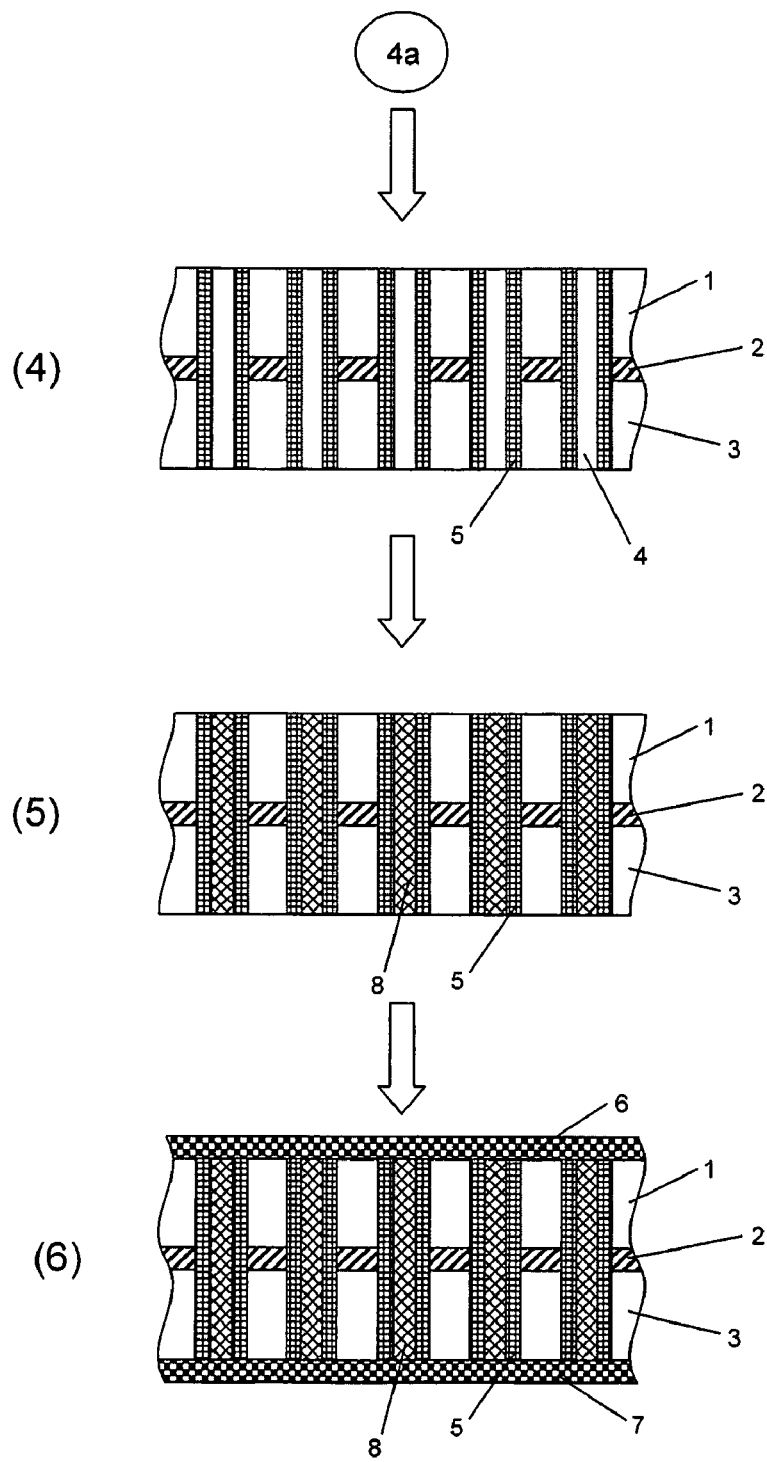

The method of fabrication will be explained on the basis of the sectional representation of a laminate depicted in FIGS. 4a and 4b. Initially, a metal layer 2 (e.g. Al, Cu, Ag) is applied by vapor deposition on one surface of a PET (polyethylene therephthalate) film 1 of 5 µm thickness. To form a laminate, the metal surface is then adhesively connected to a second PET film 3 of 5 µm thickness.

For forming ion trace channels in step (1), sections of about A4 size are bombarded in an accelerator with fast ions, preferably krypton or xenon ions, at an energy of several 100 MeV at a density of about $10^8/cm^2$. The resultant ion trace channels 4' in step (2) are then pretreated with a sensitizing agent (e.g. dimethyl formamide, pyridine, dioxane) before being etched in step (3) in a solution of sodium hydroxide (NaOH). Depending upon the etching time, micro holes 4 will result with a diameter between 30 nm and 20 µm. Thereafter, the center metal layer is etched (in a solution of sodium hydroxide if it is Al, for instance, in HNO3 if it is CU, etc.) Thereafter, the micro holes 4 are lined in step (4), by precipitation in a chemical bath or by another process as described in German patent specification 199 16 403, with an insulation layer 5 of $TiO_2$ or another oxide.

This is followed by an electrochemical implantation in step (5) of p-conductive copper thiocyanate 8 (CuSCN) in the micro holes 4. The dosage may be changed by adjusting the potential ratios; see C. Rost et al., Appl. Phys. Lett. 75, 692 (1999). To apply a potential, in step (6) each surface of the film laminate is provided with a metal layer of gold which subsequently will constitute a source contact 6 or a drain contact 7. The electro deposition may take place in a conventional potentiostate. A 0.05 molar $Cu(BF_4)_2$ solution and 0.025 molar KSCN in ethanol have been found to be suitable at a cathode voltage of −(0.2 to 0.8) V relative to a platinum reference electrode. It has been found to be possible to form hexagonal crystals of <001> or <101> orientation.

Figure 1:
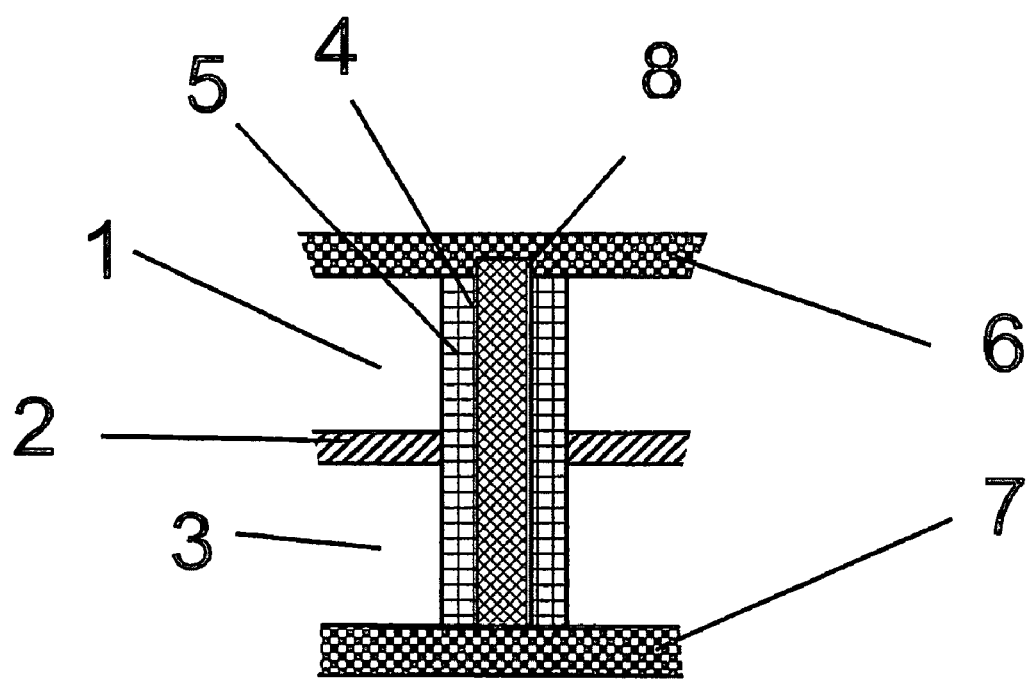
FIG. 1 is a sectional view of a transistor in accordance with an embodiment of the invention.

Following the complete filling of the micro holes 4 with CuSCN, a source contact 6 or a drain contact 7 is fabricated by vapor deposition of platinum on the second surface of the film laminate. The center metal layer 2 constitutes the gate contact. FIG. 1 is a sectional representation of a single transistor prepared according to an embodiment of the method described above.

Figure 2:
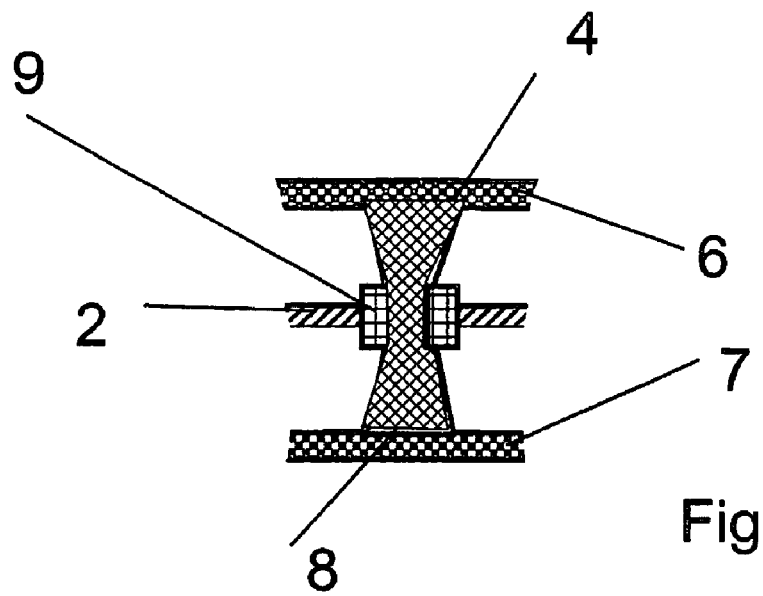
FIG. 2 is a sectional view of a second embodiment of a transistor.

Another possibility is shown in FIG. 2. As the etching progresses, micro holes 4 flaring conically outwardly are formed with a diameter in the area of the gate of about 100 nm. The metal layer consists of aluminum. At its margin, it is electro-chemically oxidized to aluminum oxide 9 at the etched out micro holes 4 so that the need to apply an insulation layer is avoided.

Figure 3:
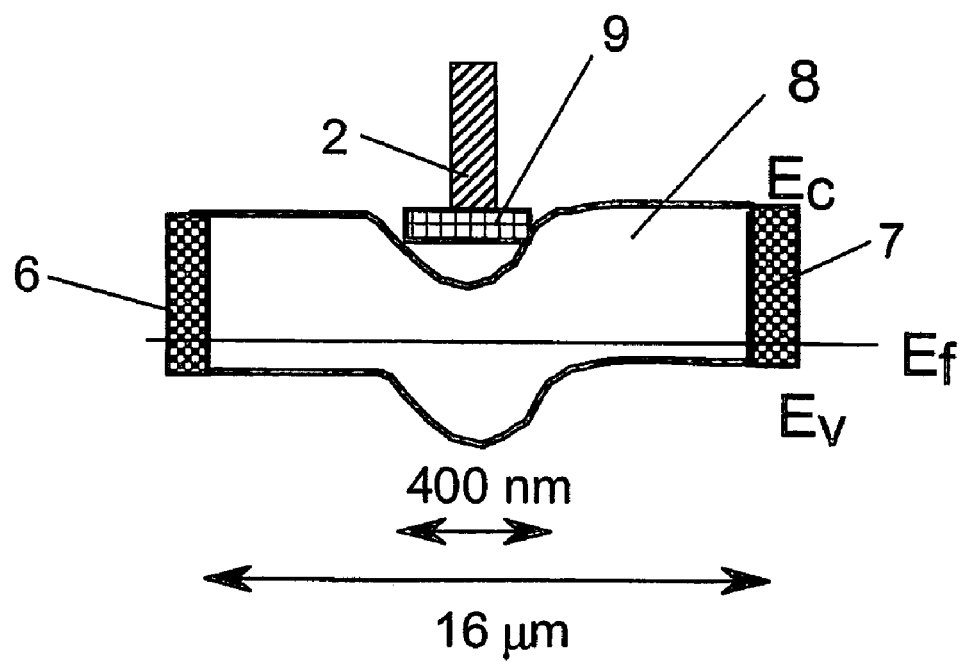
FIG. 3 depicts the energy band gap of a transistor in accordance with an embodiment of the invention.

FIG. 3 depicts the energy conditions of the electron flow in such a transistor. The gate results in a space charge zone of a length of about 400 nm in which the potential of the CuSNC may be shifted. Since CuSNC is p-conductive, depletion in the channel results in a positive gate potential. When the depletion extends through the entire thickness of the semiconductor cylinder, the conductivity between source and drain is significantly reduced. At a negative gate potential enrichment occurs in the channel. However, since the length of the channel is insignificant relative to the spacing between source and drain, the increase in conductivity between source and drain remains insignificant.

What is claimed is:

1. A method of fabricating a transistor assembly, comprising the steps of:
    providing a film laminate comprising first and second layers of pliable film with a metal layer therebetween;
    subjecting the film laminate to ion bombardment to provide a plurality of ion trace channels therein;
    etching the film laminate in an etching process to convert the ion trace channels to micro holes;
    vertically introducing into the micro holes a semiconductor material; and
    metal coating at least one of the outer surfaces of the film laminate to provide at least one electrical contact connected to the semiconductor material.

2. The method of claim 1, further comprising the step of subjecting the metal layer between the layers of pliable film to an etching process within the micro holes.

3. The method of claim 2, further comprising the step of lining the micro holes with an insulating layer to form a field effect transistor.

4. The method of claim 3, further comprising the step of etching away the metal layer in the area of the micro holes beyond the diameter of the micro holes to form a field effect transistor.

5. The method of claim 2, further comprising the step of electro-chemically oxidizing the metal layer in the area of the micro holes to form a field effect transistor.

6. The method of claim 1, wherein the step of introducing the semiconductor material is carried out by electrode deposition.

7. The method of claim 1, wherein the step of introducing the semiconductor material is carried out by precipitation in a chemical bath.

8. The method of claim 1, wherein the metal layer is applied to a surface of one plastic film by one of vapor deposition and sputtering.

9. The method of claim 8, further comprising the step of adhesively connecting the pliable film with the metal layer thereon and the other pliable film by adhesion.

10. The method of claim 9, further comprising the step of subjecting the film laminate to a sensitizing agent prior to etching.

11. The method of claim 1, wherein the step of etching for converting the ion trace channels to micro holes is carried out in a solution of sodium hydroxide.

12. The method of claim 1, wherein the step of ion bombardment is carried out at a density of $10^7/cm^2$ to $10^9/cm^2$.

13. The method of claim 1, wherein the step of ion bombardment is carried out at a power of several 100 MeV.

14. The method of claim 1, further comprising the step of masking the film laminate prior to metal coating.

15. The method of claim 1, further comprising the step of masking the film laminate prior to ion bombardment.

* * * * *